United States Patent [19]
Tomlinson

[11] Patent Number: 5,353,189
[45] Date of Patent: Oct. 4, 1994

[54] SURGE PROTECTOR FOR VEHICULAR TRAFFIC MONITORING EQUIPMENT

[76] Inventor: John C. Tomlinson, 892 Maderia Cir., Tallahassee, Fla. 32312

[21] Appl. No.: 968,976

[22] Filed: Nov. 2, 1992

[51] Int. Cl.⁵ .............................................. H02H 9/04
[52] U.S. Cl. ...................................... 361/118; 361/56; 361/111; 361/127
[58] Field of Search ............... 361/111, 91, 118, 119, 361/56, 127

[56] References Cited

U.S. PATENT DOCUMENTS

| | | | |
|---|---|---|---|
| 3,943,339 | 3/1976 | Koerner | 235/92 |
| 4,430,636 | 2/1984 | Bruce | 340/941 |
| 4,568,937 | 2/1986 | Clark | 340/939 |
| 4,680,717 | 7/1987 | Martin | 364/436 |
| 5,142,430 | 8/1992 | Anthony | 361/56 |

Primary Examiner—Marc S. Hoff
Assistant Examiner—S. Jackson
Attorney, Agent, or Firm—Dowell & Dowell

[57] ABSTRACT

A surge protection device for low level electronic systems and especially conventional roadway traffic monitoring equipment connected to embedded roadway sensors, which includes, for each sensor, first and second stage common mode and normal mode surge arrestor circuits and which stages are connected by a common mode choke in series with the sensor circuit and monitoring equipment. The first and second stage surge arrestor circuits and choke are preferably mounted on surge arrestor circuit boards having enlarged conductive traces and peripheral ground contact surfaces which enable large surge currents to pass to ground when the boards are mounted to a common grounding backplane.

14 Claims, 3 Drawing Sheets

SURGE PROTECTOR FOR VEHICULAR TRAFFIC MONITORING EQUIPMENT

BACKGROUND OF THE INVENTION

1. Field of the Invention

This invention is generally related to traffic monitoring systems and, more particularly, to surge protectors including arrestor circuits and related circuit boards which are mounted between telemetering and other monitoring equipment and roadway embedded inductive loops, piezo electric sensors and/or strain gauge weigh bridges.

2. History of the Related Art

There are generally three types of conventional sensors which are used to monitor, count, classify and weigh vehicles traveling on roadways. These basic sensors are known as inductive loop sensors, piezo electric sensors and strain gauge weigh bridges. The sensors are designed to be embedded in, or placed on, a roadway and are connected to monitoring and/or telemetering equipment which receive signals from the sensors and communicate the information received from the sensors to remote locations. Typically, the monitoring and telemetering equipment are mounted in roadside cabinets adjacent the sensors and are either powered by an available source of AC current or by solar powered. The monitoring equipment may also include a modem for communications over a conventional telephone line.

Conventional roadway traffic sensors are sensitive to environmental conditions and therefore various types of surge protectors have been used for isolating the effect of stray signals associated with the grounding systems and for providing protection from high voltage surges from lightning strikes. However, it has been found in many instances that the surge protection devices utilized with conventional systems, and in particular loop traffic sensors, have not been adequate and such devices exhibit an extremely high failure rate especially during seasons of increased electrical storm activity.

Conventional loop sensor circuits include a loop oscillation circuit which is connected in series with inductive loops or coils located in a roadway. Prior protection devices have included isolation transformers mounted between the loop oscillator circuit and the roadway loops to provide for common mode and differential lightning protection, ground isolation and common mode and low frequency noise rejection. In addition, diodes and voltage limiting neon tubes have been used with the transformers to provide some limited protection from surges caused by lightning. See for instance, U.S. Pat. No. 3,943,339.

Unfortunately, such surge protection devices have not proven to be satisfactory. In operation, such surge arrestors function as fuses and are generally completely destroyed when subject to the current surge caused by a lightning strike. Failure is often caused by the inability of the circuit boards to which the components of the surge arrestors are mounted to withstand high voltage surges. The conductive traces associated with such boards are very small, in the range of 0.01 inch to 0.020 inch, and are thus not able to withstand the high current associated with an electrical surge caused by a lightning strike. Further, the use of neon tubes typically employed as voltage limiters in conventional surge protectors are frequently vaporized by lightning surges which have the capability of producing thousands of amperes of current. Upon the failure of the neon tubes, other monitoring equipments can be destroyed by the pass-through voltage caused by high energy surge. Also, the isolation transformers utilized in such systems are generally small printed circuit devices having less than 300 volts of isolation or withstanding capability. Such transformers are frequently destroyed by the pass-through voltage resulting from the destruction of the neon tubes.

In view of the foregoing, conventional surge protectors used with traffic monitoring equipment have not proven to be adequate in actual use to protect circuits from high surges caused by electrical storm activity. This has led to frequent down time of the traffic monitoring stations and the need for repeated expenditures for maintenance, repair and/or replacement of equipment.

SUMMARY OF THE INVENTION

This invention is directed to surge protecting devices for use between roadway traffic sensors and their related monitoring equipment wherein each surge protector is mounted to a circuit board and includes first and second stage surge current arresting circuits which are interconnected or separated by a current limiting device such as a common mode choke. In the preferred embodiment, the first stage surge current arrestor circuit includes an input connected to the roadway traffic sensor and further consists two Metal Oxide Varistor (MOV) Surge Arrestors which are mounted in parallel with two Gas Tube Surge Arrestors each of which is connected between the roadway sensor and ground to act on common mode transient signals. The first stage further includes a Metal Oxide Varistor which is connected between the two inputs so as to provide a voltage limiter for normal mode transients.

In the preferred embodiment, the current limiting device is a common mode choke having two coils wound on a single ferrite toroidal core. The second stage surge current arrestor circuit includes two Metal Oxide Varistor (MOV) Surge Arrestors for use as common mode protection devices and a Zener Diode Surge Arrestor for providing normal mode transient surge protection.

In order to prevent the destruction of the circuit boards to which the surge arrestor components are mounted, the present invention includes specially designed circuit boards which are positively connected to a grounding backplane which is mounted within the cabinet or housing in which the equipment of a traffic monitoring system is installed. The backplane is designed to be positively connected to the earth grounding system of the equipment housing. The conductive traces utilized on the circuit board are much larger than the conductive traces associated with conventional boards so as to give the circuit low DC resistance and to provide low surge impedance by minimizing the skin effect and circuit inductance. The traces are provided by forming conductive islands which are spaced over a major portion of the circuit board and by providing a conductive ground ring about the perimeter of each circuit board which assures an enlarged ground connection when each circuit board is connected to the backplane. This design withstands surge currents of thousands of amperes without acting as a fuse and therefore is not destroyed by surge current from a lightning strike.

It is a primary object of the present invention to provide a surge protector which may be utilized with any type of conventional roadway traffic monitoring or sensing equipment including inductive loop sensors, piezo sensors and strain gauge weigh bridges to prevent destruction of such equipment even in the event of high power surges caused by lightning strikes.

It is yet another object of the present invention to provide a surge protection device for vehicular traffic monitoring equipment which is especially well suited for use with inductive loop sensing systems of the type which utilize an LC tank circuit and wherein the surge protection device functions without desensitizing or de-tuning the LC circuit and thus does not adversely affect the resonant frequencies of the LC circuit.

It is also an object of the present invention to provide surge protection devices for traffic monitoring systems wherein the surge protection electronic components are mounted to circuit boards which are capable of allowing large surge currents to pass therethrough without destroying the circuit board traces and wherein the circuit boards are assured of positive grounding upon their mounting to a common grounding backplane which is positively connected to ground through the earth grounding system associated with a conventional traffic monitoring equipment station.

DESCRIPTION OF THE PREFERRED EMBODIMENT

Figure 1:
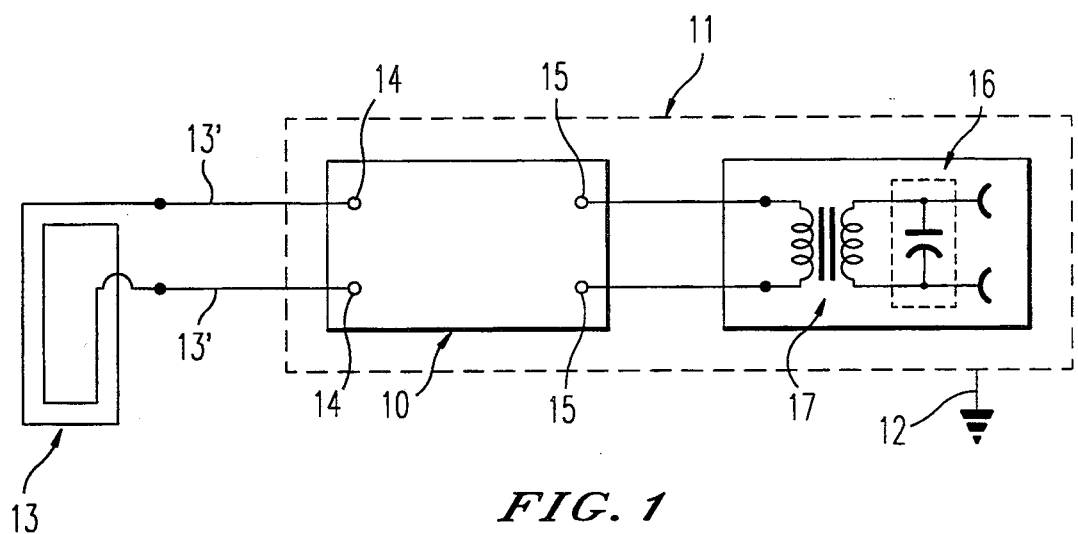
FIG. 1 is a circuit diagram showing the placement of the surge protector of the present invention in series between the inductance loop of a traffic loop monitoring system and an LC oscillator which is part of the loop detecting equipment.

As previously discussed, the surge protectors of the present invention have been designed for use with conventional traffic monitoring equipment which incorporate inductance loop sensors, piezo sensors and strain gauge weigh bridges. The surge protectors 10 are mounted in series between the embedded roadway sensors and the related or associated traffic monitoring equipment which includes sources of energy supply for the roadway sensors, telemetering equipment, modem equipment, traffic counters and the like, all of which are not shown in the drawings. Generally, the monitoring and transmitting equipment is mounted in an enclosed housing generally indicated in FIG. 1 at 11 which housing is grounded utilizing a very low impedance earth driven grounding device generally indicated at 12.

A surge protector of the present invention is shown in FIG. 1 as it is installed in an inductance loop traffic monitoring system. The surge protector 10 is connected in series with an embedded inductance loop 13 which is installed in a lane of a roadway. Conventionally, the loop is formed of 2 or 3 turns of an insulated one conductor cable. The loop ends are connected to a two conductor shielded cable (see 13' of FIGS. 1 and 5) which extends to the spaced inputs 14 of the surge protector 10. As shown, the surge protectors are installed directly within the equipment monitoring housing 11 and are positively connected to the housing's earth ground system 12.

The outputs 15 of the surge arrestor are connected to an LC oscillator circuit generally designated at 16 which may be of any conventional type. See for example, the systems disclosed in U.S. Pat. Nos. 3,943,339 to Koerner et al., 4,430,636 to Bruce, 4,568,937 to Clark and 4,680,717 to Martin. The connections between the surge protector and the monitoring equipment will generally be made through a coupling transformer 17, although a transformer may not always be necessary. Once again, it is the object of the surge protector of the present invention to protect the LC oscillator circuit and the related monitoring equipment from large surge currents especially developed by lightning strikes and which functions in a normal mode to prevent any de-tuning of the LC oscillator frequencies.

Figure 4:
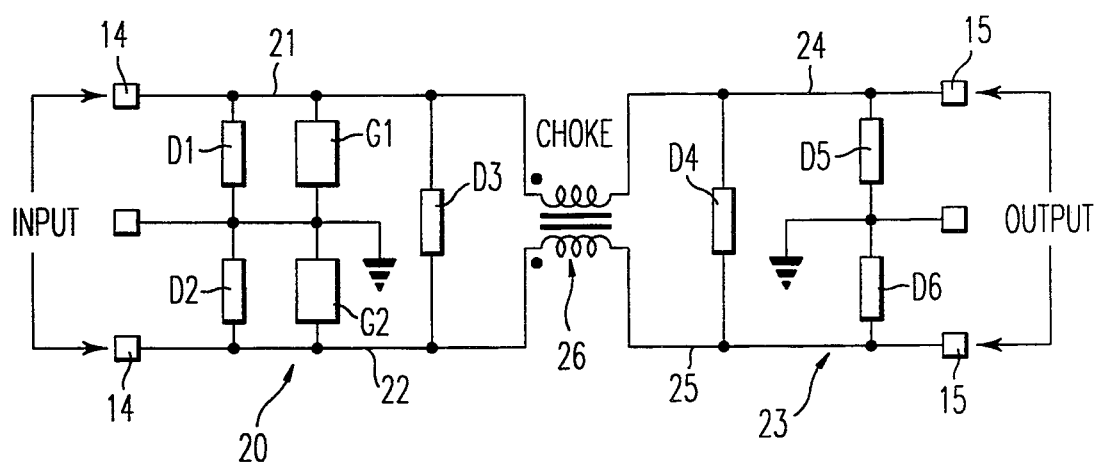
FIG. 4 is a circuit diagram of the two stage surge protector circuit of the present invention.
Figure 2:
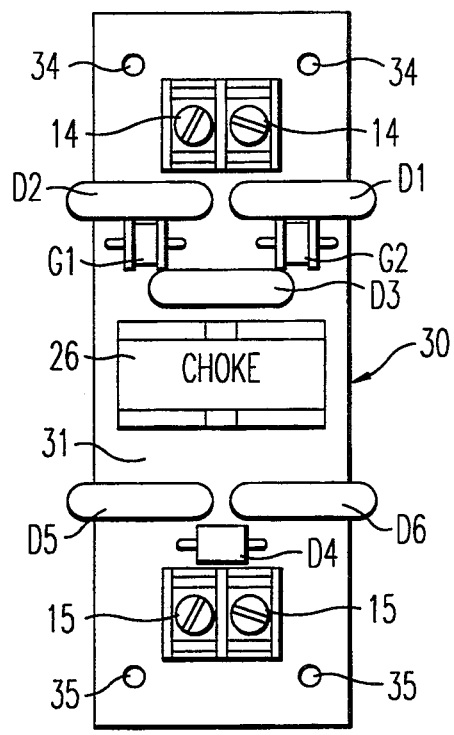
FIG. 2 is a top plan view of the surge protector circuit board of the present invention showing the electrical components mounted thereto.

In order to absorb and to dissipate to the earth ground 12 the surge energy created from a lightning strike, and to protect the monitoring equipment by maintaining the lowest possible surge voltages thereto, the present invention utilizes a two-stage common and normal surge current arrestor circuit system. With particular reference to FIGS. 2 and 4, the two-stage surge arrestor circuit of the present invention is disclosed in greater detail. The first stage 20 includes a plurality of surge limiting components including two Metal Oxide Varistors (MOV) Surge Arrestors D1 and D2 and two Gas Tube Surge Arrestors G1 and G2 each of which are connected between the incoming conductors 21 and 22 from the inputs 14. Each of the surge current limiting components are also connected to the equipment ground 12 in a manner which will be described in more detail hereinafter. The surge arrestors D1 and D2 and G1 and G2 act on common mode transients such as voltage increases caused by lightning strikes to dissipate the surge current to ground. The first stage also includes a Metal Oxide Varistor Surge Arrestor D3 which is connected to the incoming conductors 21 and 22 and which act on normal mode transients affecting the system. As shown, the MOV Surge Arrestor D1 is mounted in parallel with Gas Tube Arrestor G1 and MOV Surge Arrestor D2 is mounted in parallel with Gas Tube Arrestor G2.

The second stage 23 of the surge protector 10 includes a Zener Diode Surge Arrestor D4 which is connected across output lines 24 and 25 and is provided for normal mode transient protection. The two Metal Oxide Varistor Surge Arrestors D5 and D6 are connected to ground for common mode protection and are also connected to the output signal lines 24 and 25. The lines 24 and 25 are connected to the outputs 15 of the surge protector 10.

The first and second stages 20 and 23 of the surge protector must be separated by a current limiting device which will not interfere with the frequency oscillations of the LC circuit. The use of resistors would not be appropriate as they would tend to lower the Q of the LC oscillator circuit interrupting the oscillator's operation. Likewise, inductors would de-tune and desensitize the loop oscillator. In this respect, a common mode choke 26 is utilized. The choke includes two coils wound on a single ferrite or magnetic toroidal core. The choke is shown as being connected between the input conductors 21 and 22 and the output conductors 24 and 25. If it is assumed that the loop inductance of the sensor system is generally more that 1 millihenry, the common mode inductance of the choke, for example, may be 3 millihenrys and the normal mode inductance 35 microhenrys. The LC oscillator circuit will see the 35 microhenrys which is extremely small compared to the roadway loops inductance of greater than 1 millihenry. Thus, the LC oscillator circuit is not desensitized or de-tuned by the choke.

It should be noted that the current ratings of the surge arrestor components D1–D6 and G1 and G2 may vary depending upon the specific installation and depending upon the type of traffic monitoring system, i.e. inductance loop, piezo sensor or strain gauge weigh bridge. By way of example, in the inductance loop detection system set forth above, the MOV arrestors D1 and D2 are "PANASONIC" components ZNR 20K201U, the two Gas Tube Surge Arrestors G1 and G2, "SIEMENS" components B1-C75, the MOV arrestor D3, "PANASONIC" ZNR 20K820U, the Zener Diode Transient Surge Arrestor D4, "GENERAL" semiconductor component P6KE30CA and the MOV arrestors D5 and D6, "HARRIS" semiconductor units 18ZA3.

It is important that the components of the present invention be capable of conducting and dissipating surge currents effectively to ground so as to protect the equipment in the event of specially large surge current developed by environmental conditions such as lightning strikes. In this respect, the present invention incorporates a unique circuit board for mounting the circuit components and a common grounding backplane for each of the circuit boards. The common grounding backplane insures that the ground contacts from the circuit boards is positively connected to the grounding system 12 of the equipment housing when the boards are mounted thereto. As previously discussed, conventional surge protecting devices utilized in traffic monitoring systems have functioned much like fuses, being destroyed by surge currents passing therethrough. The present invention, however, is designed to dissipate such currents without destruction of the circuit components or the circuit boards.

Figure 3:
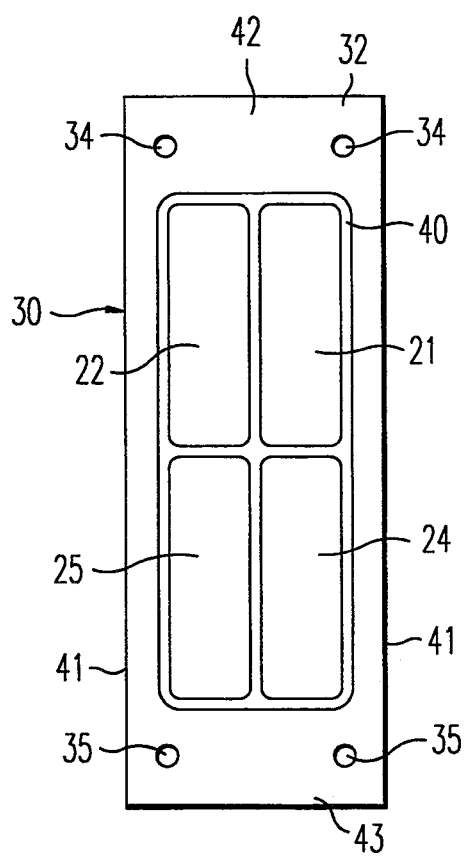
FIG. 3 is a bottom plan view of the circuit board of FIG. 2 showing the enlarged conductive traces and the perimeter ground contact area of the circuit board.
Figure 3A:
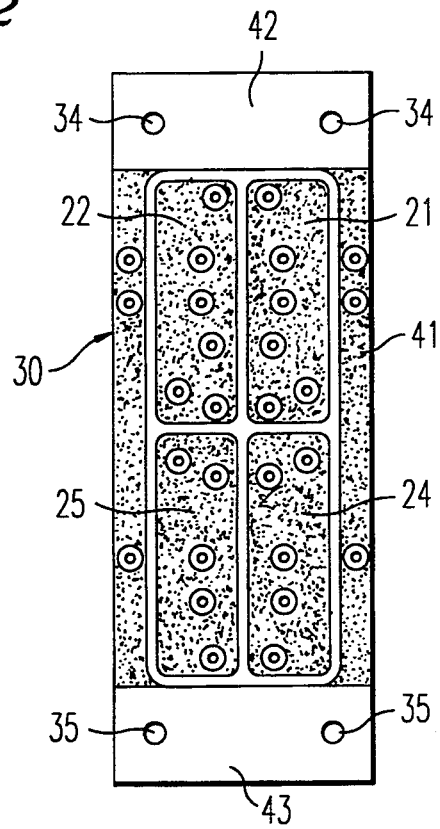
FIG. 3A is a bottom plan view similar to FIG. 3 after a solder mask has been applied.

With particular reference to FIGS. 2, 3 and 3A, the circuit board 30 for each of the surge protectors 10 of the present invention is disclosed in greater detail. FIG. 2 shows the various electrical components previously identified in the description of the circuit diagram of FIG. 4 as they are mounted to the top of the circuit board. The circuit board has an upper surface 31 and lower surface 32 and is provided with a pair of openings 34 and 35 at each end thereof for purposes of mounting the circuit board to a grounding backplane 36, as will be discussed in greater detail hereinbelow. With the present invention, the conductive traces between each of the electrical components of the surge protector are maximized in order to create low surge impedance by minimizing the DC resistance, skin effect and circuit inductance of the unit. In this respect, the conductive traces are provided by leaving most of the copper on the rear surface 32 of the circuit board in the form of conducting islands which corresponds to the circuit conductors 21 and 22 of stage 20 and 24 and 25 of stage 23, each of which are separated by a non-conductive area reflected by the grid pattern 40. The perimeter of grid pattern 40 is spaced inwardly from the sides of the circuit board leaving the space outside also copper coated thereby forming a continuous grounding ring 41 which communicates with the mounting openings 34 and 35. The grounding ring should be at least approximately 0.1 inch in width. Preferably, each island extends over approximately one-third of the width and length of the circuit board. The copper is preferably applied as a foil laminate to the circuit board at two (2) ounces per square foot.

Figure 5:
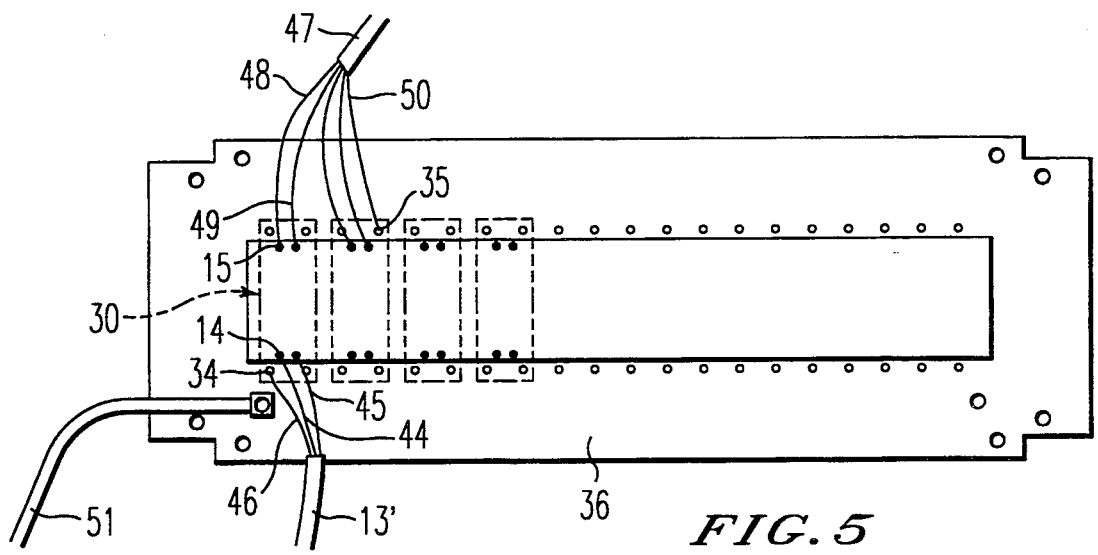
FIG. 5 is a top plan installation view of the common grounding backplane to which the surge protector circuit boards of the present invention are installed when used in a typical inductance loop traffic monitoring system.
Figure 6:
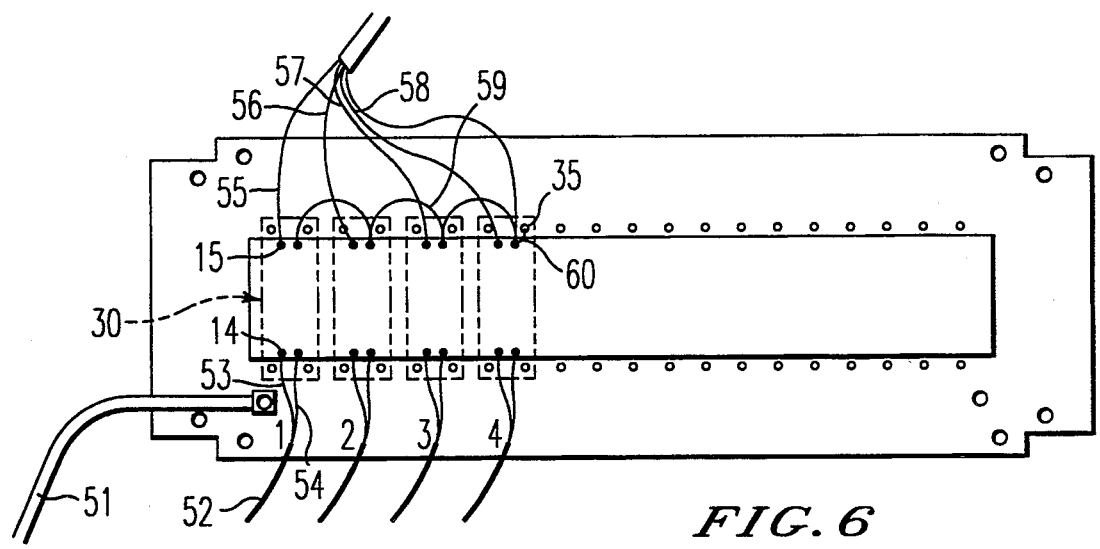
FIG. 6 is a top plan view of the common grounding backplane having the surge protectors of the present invention mounted thereto showing typical connections of the surge arrestor between a piezo roadway sensor and its related traffic monitoring equipment.
Figure 7:
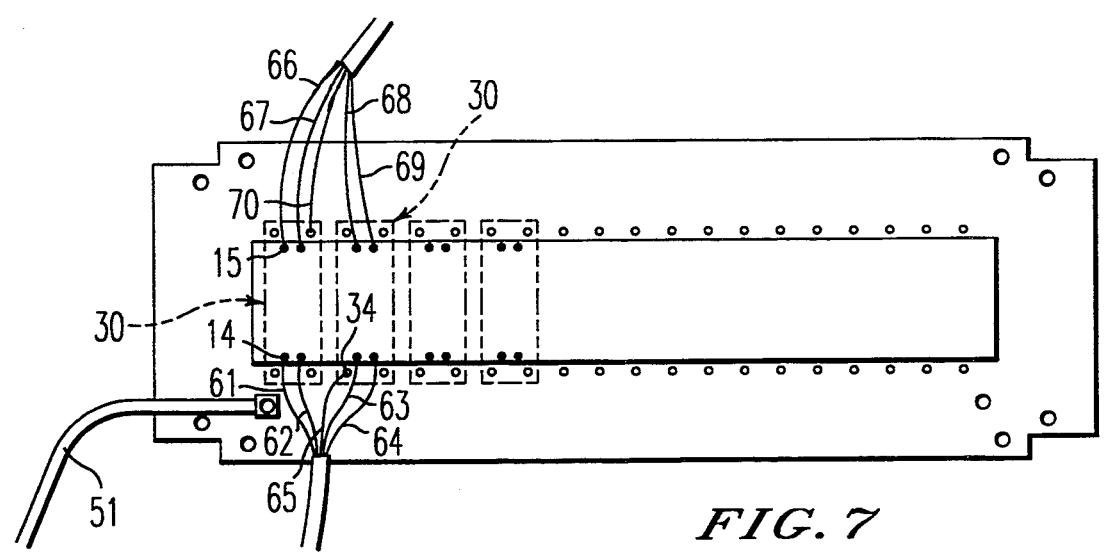
FIG. 7 is a top plan view similar to FIGS. 5 and 6 showing the installation of the surge protectors between a weigh pad cable and the traffic monitoring equipment.

With specific reference to FIG. 3A, the lower surface of the circuit board is shown having a solder mask applied thereto. The connections of the electrical components to the interior island traces or conductors 21, 22, 24 and 25 and to the ground ring 41 are also shown. It should be noted that the end portions 42 and 43 of the ground ring 41 are not covered by the solder mask. In this manner, and as is shown in FIGS. 5–7, after the circuit boards are mounted to the common ground backplane 36, the unmasked end portions 42 and 43 will be in electrical contact with the backplane. Each circuit board is secured to the backplane by the use of pairs of screws disposed through the openings 34 and 35.

Due to the large conductive trace areas forming conductors 21, 22, 24 and 25, the surge current being limited by the common mode surge arrestors D1, D2, G1, G2, D5 and D6 will be effectively conducted to the ground ring 41 and then to the backplane 36. As the backplane is grounded to the earth ground 12 of the traffic monitoring equipment housing, the surge currents are effectively dissipated without damage to the circuit board 30, conductive areas 21, 22, 24 and 25 or the electrical components of the surge protector.

With specific reference to FIGS. 5–7, the circuit boards 30 having the surge arrestor components mounted thereto are shown as being mounted to the grounding backplane 36 which is installed within the traffic monitoring equipment housing with the connections to the monitoring equipment and the sensors being shown in greater detail. The backplane is preferably constructed of aluminum. FIG. 5 shows the installation in a typical inductive loop sensor system. In an inductive loop sensing system there are twisted pairs of conductors generally mounted or disposed within a braided shielded cable. As previously discussed, 2–3 coils of the conductors are placed or embedded within the roadway. The two conductor wires 44 and 45 of the roadway loop cable 13 are shown as being connected directly to the inputs 14 of the surge protector. The shielded cable lead 46 is connected directly to ground by one of the fasteners passing through one of the mounting openings 34. The output side of the surge protector is connected to a shielded loop cable 47. The cable has a first pair of lead wires extending from the LC oscillating circuit which wires are identified at 48 and 49 and are connected to the output terminals 15 of the surge protector while a shield lead wire 50 is connected directly to ground through one of the openings 35. The grounding backplane 36 further includes a separate ground wire 51 which connects to the grounding system 12 of the equipment monitoring housing.

With respect to FIG. 6, a typical four (4) piezo sensor installation utilizing the surge protectors of the present invention is shown. In the example, 4 circuit boards 30 are shown as mounted to the backplane 36. The piezo sensors include a coaxial cable 52 which extends from the roadway to the equipment cabinet. The center conductor 53 of the coaxial cable 52 goes to one side of the input 14 of the circuit board and the braided shield lead 54 goes to the other side of the input. The equipment cables on the output side of the surge arrestor circuit boards are shown as including two pairs of conductors and a shielded cable. The conductors are identified at 55, 56, 57, and 58. Conductor 55 is shown as being connected to one of the outputs 15 of the first circuit board 30 whereas the conductors 56, 57 and 58 are each connected to one of the outputs 15 of the adjacent circuit boards. The other of the outputs 15 of each of the circuit boards are interconnected by jumper connectors 59 with a common connection 60 thereafter being made to the last ground screw opening shown at 35. Again, in the example, there are 4 piezo electric sensors installed utilizing a single two-pair cable from the circuit boards to the monitoring equipment.

With specific reference to FIG. 7, a typical weigh pad installation is shown utilizing the surge protectors of the present invention. In this installation, two surge arrestor circuit boards 30 are required for each sensor. The cables coming from the roadway for the weigh bridges include two pairs of conductors 61, 62 and 63 and 64. The first pair of conductors 61 and 62 of the cable go into the input 14 of the first surge arrestor board and are used for the excitation of the weigh bridge from the monitoring equipment. The other pair of cables 63 and 64 go into the input of the second surge arrestor board are used to convey the signal back to the equipment from the weigh bridge. The shield lead 65 for the cable is shown as being connected to one of the ground connections of the second surge arrestor board. On the output side of the surge arrestor boards, a first pair of cables 66 and 67 are connected to the outputs 15 of the first surge arrestor board 30 while a second pair, 68 and 69, are connected to the outputs 15 of the second surge arrestor board. A common shield ground wire 70 is connected to the ground screw extending through the opening 35 in the first circuit board.

I claim:

1. A surge protection device for use between a roadway traffic sensor and its related monitoring equipment to limit common mode and normal mode transients comprising, first and second stage surge current arrestor circuits, each of said first and second stage surge current arrestor circuits including common mode surge limiting means and normal mode surge limiting means connected with one another, means for connecting said common mode surge limiting means to ground, input means for connecting said first stage surge arrestor circuit to the roadway traffic sensor, output means for connecting said second stage surge arrestor circuit to the monitoring equipment, and a choke means connecting said first and second stage surge arrestor circuits.

2. The surge protection device of claim 1 in which each of said common mode surge limiting means includes a pair of surge arrestors.

3. The surge protection device of claim 2 in which said first stage surge current arrestor circuit includes a pair of common mode surge limiting means.

4. The surge protection device of claim 3 in which said choke means includes at least two coils wound on a single magnetic core.

5. The surge protection device of claim 4 in which one of said pair of common mode surge limiting means of said first stage surge current arrestor circuit and said common mode surge limiting means of said second stage surge current arrestor circuit are metal oxide varistor surge arrestors.

6. The surge protection device of claim 5 in which the other of said pair of common mode surge limiting means of said first stage surge current arrestor circuit includes a pair of gas tube surge arrestors.

7. The surge protection device of claim 6 in which said normal mode surge limiting means of said first stage surge current arrestor circuit is a metal oxide varistor surge arrestor.

8. The surge protection device of claim 7 in which said normal mode surge limiting device of said second stage surge current arrestor circuit is a zener diode surge arrestor.

9. The surge protection device of claim 8 in which said first and second stage surge current arrestor circuit means and said choke means are mounted on a circuit board, said circuit board having upper and lower surfaces, opposite end portions and side edges, said lower surface of said circuit board having four enlarged conductive trace areas which are spaced from one another by nonconductive grids, and conductive areas adjacent each end and extending inwardly from each side to form a continuous grounding ring, and each of said common mode surge limiting means being electrically grounded to said continuous grounding ring.

10. The surge protection device of claim 9 including a common ground backplane means, said backplane means having a plurality of openings therein, said circuit board means having a pair of spaced openings adjacent each end thereof, and fastener means extending through said openings in said circuit board for securing said circuit board to said openings in said backplane so that said grounding ring is in grounding contact with said backplane.

11. The surge protection device of claim 10 in which said circuit board has a width dimension and a length dimension, each of said conductive trace areas extending continuously along approximately one-third of said width dimension and one-third of said length dimension.

12. A surge protection device for use between a roadway traffic sensor and its related monitoring equipment to limit common mode and normal mode transients comprising, first and second stage surge current arrestor circuits, each of said first and second stage surge current arrestor circuits including a first pair of common mode surge limiting means and a normal mode surge limiting means connected with one another, said first stage surge current arrestor circuit having a second pair of surge current limiting means, means for connecting each of said common mode surge limiting means to ground, input means for connecting said first stage surge arrestor circuit to the roadway traffic sensor, output means for connecting said second stage surge arrestor circuit to the monitoring equipment, and a choke means connecting said first and second stage surge arrestor circuits.

13. The surge protection device of claim 12 in which each of said pair of common mode surge limiting means includes a pair of surge arrestors.

14. The surge protection device of claim 13 in which said choke means includes at least two coils wound on a magnetic core.

* * * * *